(12) United States Patent
Han et al.

(10) Patent No.: US 11,264,532 B2
(45) Date of Patent: Mar. 1, 2022

(54) MANUFACTURING METHOD OF SEMICONDUCTOR LIGHT EMITTING DEVICE

(71) Applicant: SAMSUNG ELECTRONICS CO., LTD., Suwon-si (KR)

(72) Inventors: Daeyeop Han, Hwaseong-si (KR); Kiwon Park, Suwon-si (KR); Jaeyoon Kim, Yongin-si (KR); Sungjoon Kim, Yongin-si (KR); Inho Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/727,496

(22) Filed: Dec. 26, 2019

(65) Prior Publication Data

US 2021/0013369 A1 Jan. 14, 2021

(30) Foreign Application Priority Data

Jul. 8, 2019 (KR) .................. 10-2019-0081791

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01); *H01L 33/0075* (2013.01); *H01L 2933/005* (2013.01); *H01L 2933/0066* (2013.01)

(58) Field of Classification Search
CPC ............ H01L 33/0095; H01L 25/0753; H01L 2933/0066; H01L 2933/005
See application file for complete search history.

(56) References Cited

U.S. PATENT DOCUMENTS 6,248,667 B1 6/2001 Kim et al.
6,372,608 B1 * 4/2002 Shimoda ............ H01L 27/1214
438/455

(Continued)

FOREIGN PATENT DOCUMENTS

KR 10-0343136 B1 7/2002
KR 10-2015-0138479 A 12/2015

(Continued)

*Primary Examiner* — Jay C Chang
*Assistant Examiner* — Mikka Liu
(74) *Attorney, Agent, or Firm* — Sughrue Mion, PLLC

(57) ABSTRACT

Provided a manufacturing method of a semiconductor light emitting device including forming a plurality of light emitting cells that are separated on a first substrate, forming a first planarization layer by providing an insulating material on the plurality of light emitting cells, forming a second planarization layer by providing a photoresist on the first planarization layer to have a flat upper surface, and soft baking the photoresist, and dry etching the second planarization layer to a predetermined depth to expose a portion of the first planarization layer provided on the plurality of light emitting cells, and a portion of the second planarization layer remaining between the plurality of light emitting cells on the first planarization layer, wherein forming the second planarization layer and dry etching are repeated at least once to remove the portion of the second planarization layer provided between the plurality of light emitting cells.

20 Claims, 18 Drawing Sheets

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,281,192 B2 | 3/2016 | Liu et al. |
| 2012/0018734 A1* | 1/2012 | Chae ............... H01L 33/382 257/76 |
| 2013/0292719 A1* | 11/2013 | Lee ............... H01L 27/156 257/93 |
| 2014/0061861 A1* | 3/2014 | Moustakas ....... H01L 21/30621 257/615 |
| 2015/0349201 A1 | 12/2015 | Lee |
| 2018/0033633 A1* | 2/2018 | Tsai ............... H01L 21/31058 |
| 2018/0047584 A1 | 2/2018 | Pereira et al. |
| 2019/0074353 A1 | 3/2019 | Zhao |
| 2019/0080922 A1 | 3/2019 | Khusnatdinov et al. |
| 2019/0187376 A1 | 6/2019 | Nguyen et al. |

FOREIGN PATENT DOCUMENTS

| | | |
|---|---|---|
| KR | 10-1719901 B1 | 3/2017 |
| KR | 10-2019-0028532 A | 3/2019 |
| KR | 10-2019-0029739 A | 3/2019 |
| KR | 10-2019-0030608 A | 3/2019 |

* cited by examiner

MANUFACTURING METHOD OF SEMICONDUCTOR LIGHT EMITTING DEVICE

CROSS-REFERENCE TO RELATED APPLICATION

This application claims priority to Korean Patent Application No. 10-2019-0081791 filed on Jul. 8, 2019 in the Korean Intellectual Property Office, the disclosure of which is incorporated herein by reference in its entirety.

BACKGROUND

1. Field

Example embodiments of the present disclosure relates to a manufacturing method of a semiconductor light emitting device.

2. Description of the Related Art

A light emitting diode is a semiconductor light emitting device in which a material included in a device emits light using electrical energy. The light emitting diode converts energy generated by recombination of electrons and holes of the bonded semiconductor into light and emits the light. Such light emitting diodes are widely used in lighting, display devices, and light sources, and light sources, and their development is being accelerated.

With the recent commercialization of mobile phone keypads, turn signal lamps, and camera flashes using gallium nitride (GaN)-based light-emitting diodes, which have been actively developed and used, general lighting using semiconductor light emitting devices has been active developed. Similar to backlight units of large TVs, automotive lamps, and general lighting, applications of semiconductor light emitting devices are gradually increasing in size, high output, and high efficiency and the applications thereof have gradually been widened.

Accordingly, there is a need for a method for reducing manufacturing costs of a semiconductor light emitting device.

SUMMARY

One or more example embodiments provide a method for reducing manufacturing costs of a semiconductor light emitting device.

According to an aspect of an example embodiment, there is provided a manufacturing method of a semiconductor light emitting device, the manufacturing method including forming a plurality of light emitting cells that are individually separated on a first substrate, forming a first planarization layer by providing an insulating material on the plurality of light emitting cells, a thickness of the first planarization layer being greater than a thickness of the plurality of light emitting cells, forming a second planarization layer by providing a photoresist on the first planarization layer to have a flat upper surface, and soft baking the photoresist, and dry etching the second planarization layer to a predetermined depth to expose a portion of the first planarization layer provided on the plurality of light emitting cells, and a portion of the second planarization layer remaining between the plurality of light emitting cells on the first planarization layer, wherein the forming the second planarization layer and the dry etching are repeated at least once to remove the portion of the second planarization layer provided between the plurality of light emitting cells.

According to another aspect of an example embodiment, there is provided a manufacturing method of a semiconductor light emitting device, the manufacturing method including forming a semiconductor laminate by sequentially stacking a first conductivity-type semiconductor layer, an active layer, and a second conductivity-type semiconductor layer on a growth substrate, forming a plurality of light emitting cells on a mesa region partitioned by a separation space that is formed by etching a portion of the semiconductor laminate to expose the growth substrate, the plurality of light emitting cells including a plurality of light emitting structures that share the first conductivity-type semiconductor layer, and in which the active layer and the second conductivity-type semiconductor layer are separately provided, forming a first planarization layer by providing an insulating material on the plurality of light emitting cells and the separation space, a thickness of the first planarization layer being greater than a thickness of the semiconductor laminate, forming a second planarization layer on the first planarization layer by providing a photoresist on the first planarization layer and soft baking the photoresist, and dry etching the second planarization layer to a predetermined depth from an upper surface direction of the second planarization layer to expose a portion of the first planarization layer overlapping the mesa region, and a portion of the second planarization layer provided between the plurality of light emitting cells remaining on the first planarization layer, wherein the forming the second planarization layer and the dry etching are repeated at least once to remove the portion of the second planarization layer provided between the plurality of light emitting cells.

According to another aspect of an example embodiment, there is provided a manufacturing method of a semiconductor light emitting device, the manufacturing method including forming a plurality of light emitting cells respectively including a first conductivity-type semiconductor layer, an active layer, and a second conductivity-type semiconductor layer that are sequentially stacked on a growth substrate, and partitioned by a separation space in which the growth substrate is exposed, forming a first planarization layer including an upper surface that is higher than an upper surface of the second conductivity-type semiconductor layer by depositing an insulating material on the plurality of light emitting cells and the separation space, forming a second planarization layer by providing a photoresist on the first planarization layer and soft baking the photoresist, and dry etching the second planarization layer to a predetermined depth from an upper surface direction of the second planarization layer to expose a portion of the second planarization layer overlapping the plurality of light emitting cells of the first planarization layer, and a portion of the second planarization layer provided between the plurality of light emitting cells remaining on the first planarization layer, wherein the forming the second planarization layer and the dry etching are repeated at least once to remove the portion of the second planarization layer positioned between the plurality of light emitting cells

BRIEF DESCRIPTION OF DRAWINGS

The above and/or other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

Figure 1:
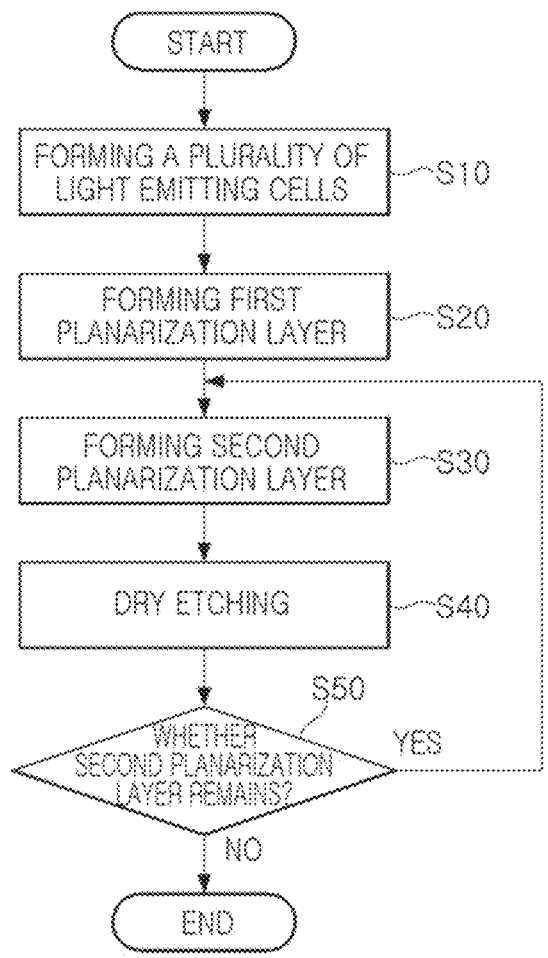
FIG. 1 is a flow chart illustrating a method of manufacturing a semiconductor light emitting device according to an example embodiment.

Referring to FIG. 1, a manufacturing method of a semiconductor light emitting device according to an example embodiment may include operations of forming a plurality of light emitting cells (S10), forming a first planarization layer (S20), forming a second planarization layer (S30), dry etching the first and second planarization layers (S40), and checking whether the second planarization layer remains (S50). The operations of forming the second planarization layer (S30) and dry etching the first and second planarization layers (S40) may be repeated according to a result of the operation of checking whether the second planarization layer remains (S50).

A manufacturing method of a semiconductor light emitting device according to an example embodiment will be described in detail with reference to FIGS. 2 to 15. FIGS. 2 to 15 are cross-sectional views illustrating processes for manufacturing a semiconductor light emitting device. The process to be described will be made at a wafer level.

Figure 2:
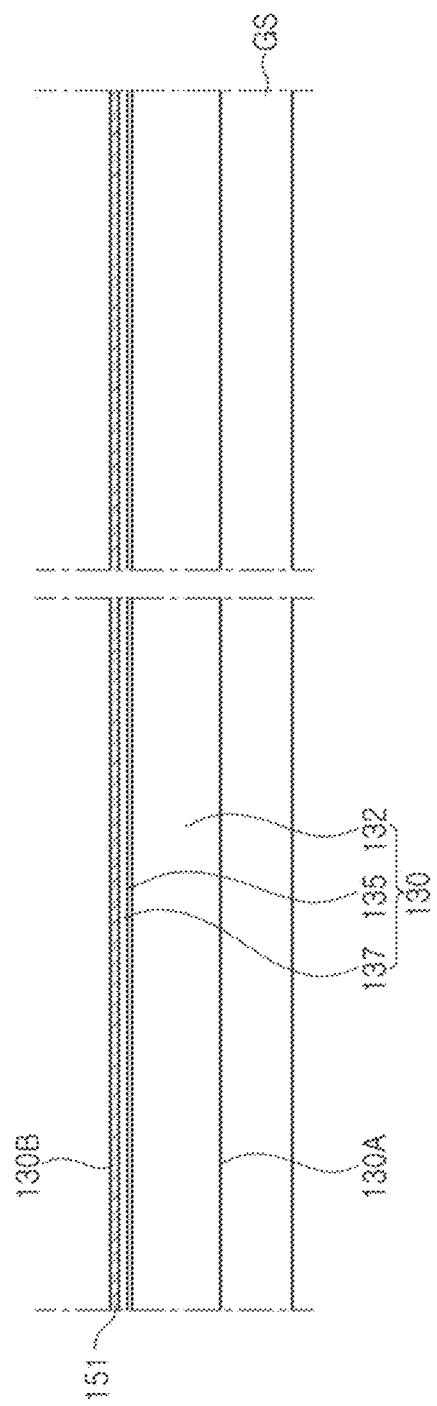
FIGS. 2 to 15 are cross-sectional views illustrating a method of manufacturing a semiconductor light emitting device according to an example embodiment.

First, an operation of forming a plurality of light emitting cells (S10) may be performed. Referring to FIG. 2, a semiconductor laminate 130 for the plurality of light emitting cells may be formed on a growth substrate GS.

The growth substrate GS is a semiconductor growth substrate, and may be provided as a wafer. The growth substrate GS may use an insulating, conductive, and semiconductor material such as sapphire, silicon carbide (SiC), magnesium aluminum oxide ($MgAl_2O_4$), magnesium oxide (MgO), lithium aluminum oxide ($LiAlO_2$), lithium gallium oxide ($LiGaO_2$), GaN, or the like. Sapphire, which is a hexa-rhombo R3c symmetry crystal, has lattice constants of 13.001 Å and 4.758 Å in c-axis and a-axis directions, respectively, and has a C (0001) plane, an A (11-20) plane, an R (1-102) plane, and the like. In this case, the C plane is mainly used as a nitride growth substrate since growth of a nitride thin film is relatively easy on the C plane, which is relatively stable at high temperatures. However, a sapphire substrate for semiconductor growth having a C plane is difficult to have a large diameter of 8 inches or more, and has a disadvantage of being expensive. When a silicon (Si) substrate is used as the growth substrate GS, large diameters of 8 inches or more are possible, and a price thereof is relatively low, and thus mass productivity may be improved.

The semiconductor laminate 130 may include a first conductivity-type semiconductor layer 132, an active layer 135, and a second conductivity-type semiconductor layer 137.

According to example embodiments, before forming the semiconductor laminate 130, a buffer layer for alleviating a difference in lattice constants between the semiconductor laminate 130 and the growth substrate GS may be formed. The buffer layer may be $In_xAl_yGa_{1-x-y}N$ ($0 \leq x \leq 1$, $0 \leq y \leq 1$). For example, the buffer layer may be aluminum nitride (AlN), aluminum gallium nitride (AlGaN), and indium gallium nitride (InGaN). The buffer layer may include a plurality of layers that are combined, or a composition of the buffer layer may be gradually changed. When the growth substrate is a silicon (Si) substrate and the nitride semiconductor is grown as the semiconductor laminate 130, the buffer layer may have various types of complex buffer structures.

The semiconductor laminate 130 may include the first conductivity-type semiconductor layer 132, the second conductivity-type semiconductor layer 137, and the active layer 135 positioned therebetween. For example, the first second conductivity-type semiconductor layer 135, the second conductivity-type semiconductor layer 137, and the active layer 135 may be hexagonal nitride semiconductors. The first conductivity-type semiconductor layer 132 may be a nitride semiconductor satisfying n-type $Al_xIn_yGa_{1-x-y}N$ ($0 \leq x \leq 1$, $0 \leq y \leq 1$, $0 \leq x+y \leq 1$), and n-type impurities may be Si. For example, the first conductivity-type semiconductor layer 132 may be n-type GaN. The second conductivity-type semiconductor layer 137 may be a nitride semiconductor layer satisfying p-type $Al_xIn_yGa_{1-x-y}N$, and p-type impurities may be Mg. For example, the second conductivity-type semiconductor layer 137 may be p-type AlGaN/GaN. The active layer 135 may have a multi-quantum well (MQW) structure in which a quantum well layer and a quantum barrier layer are alternately stacked. For example, when the nitride semiconductor is used, the active layer 135 may be a GaN/InGaN MQW structure. The semiconductor laminate 130 may have a first surface 130A and a second surface 130B provided on the first and second conductivity-type semiconductor layers 132 and 137, respectively.

The semiconductor laminate 130 may be grown on the growth substrate GS by using processes such as metal organic chemical vapor deposition (MOCVD), hybrid vapor phase epitaxy (HVPE), molecular beam epitaxy (MBE), and the like. According to example embodiments, an ohmic contact layer 151 may be further formed on the second conductivity-type semiconductor layer 137. For example, the ohmic contact layer 151 may be formed of indium tin oxide (ITO).

Figure 3:
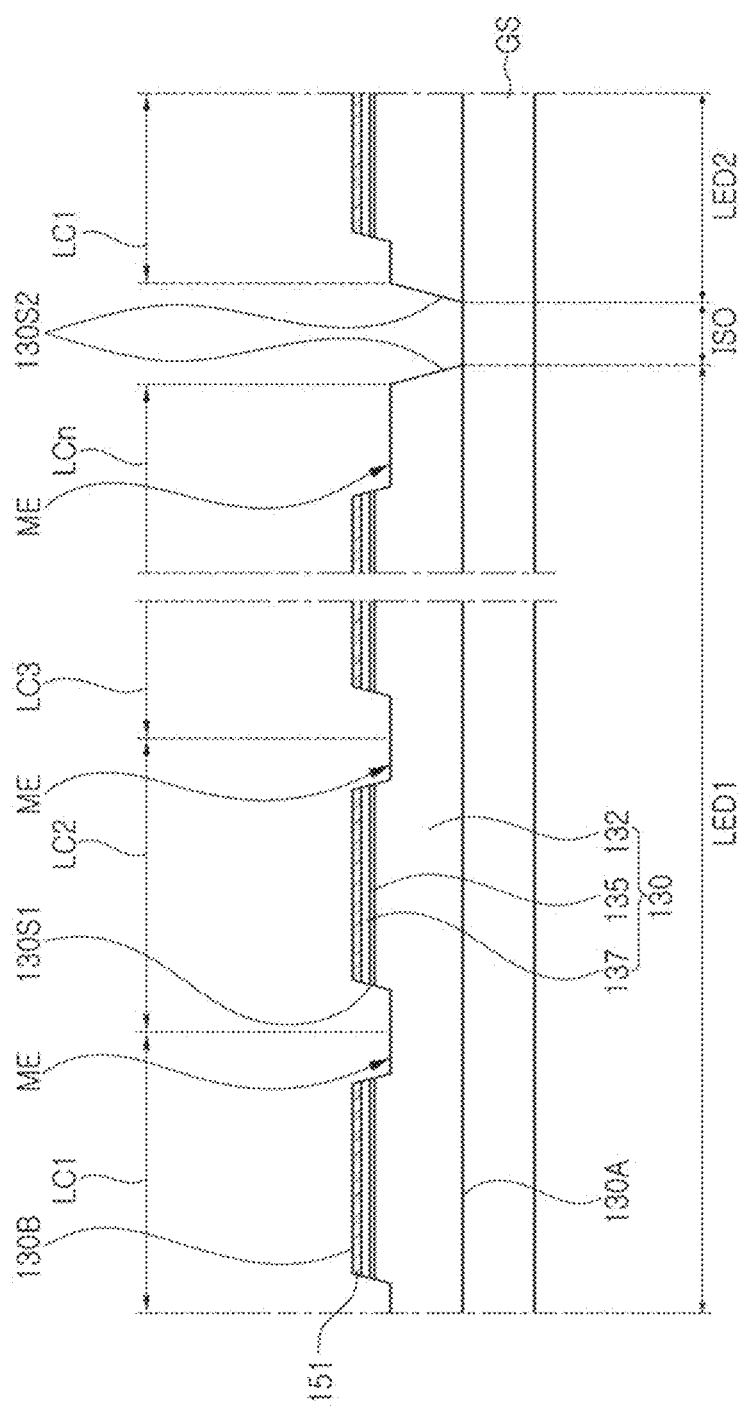

Subsequently, referring to FIG. 3, portions of the second conductivity-type semiconductor layer 137 and the active layer 135 may be removed to form a mesa-etched region ME, to expose a portion of the first conductivity-type semiconductor layer 132 in the semiconductor laminate 130. A portion of the first conductivity-type semiconductor layer 132 may be removed in the process of forming the mesa-etched region ME.

By this process, a mesa structure may be formed in the second conductivity-type semiconductor layer 137 and the active layer 135. The mesa structure may be a region for distinguishing a light emitting structure in a subsequent process.

In addition, one region of the mesa-etched region ME may be further etched to form a device isolation region ISO in which the growth substrate GS is exposed. The device isolation region ISO is a separation space that may separate the semiconductor laminate 130 into individual light emitting cells in a subsequent process. That is, the device isolation region ISO may be defined as a region for distinguishing a plurality of light emitting cells LED1 and LED2. In FIG. 3, only the first light emitting cell LED1 and the second light emitting cell LED2 are shown, but embodiments are not limited thereto.

In an example embodiment, the semiconductor laminate 130 may be formed of a multi junction structure, in which the semiconductor laminate 130 is divided into a plurality of limit emitting structures LC1 to LCn and sharing the first conductivity-type semiconductor layer 132. In addition, the semiconductor laminate 130 may be divided into a plurality of light emitting cells LED1 and LED2 by the device isolation region ISO. The mesa-etched region ME may be formed along circumferences of the plurality of light emitting structures LC1 to LCn as well as a region between the plurality of light emitting structures LC1 to LCn. Divided side surfaces 130S1 of the plurality of light emitting structures LC1 to LCn may be surfaces inclined upward. In addition, divided side surfaces 130S2 of the plurality of light emitting cells LED1 and LED2 may also be inclined surfaces.

Figure 4:
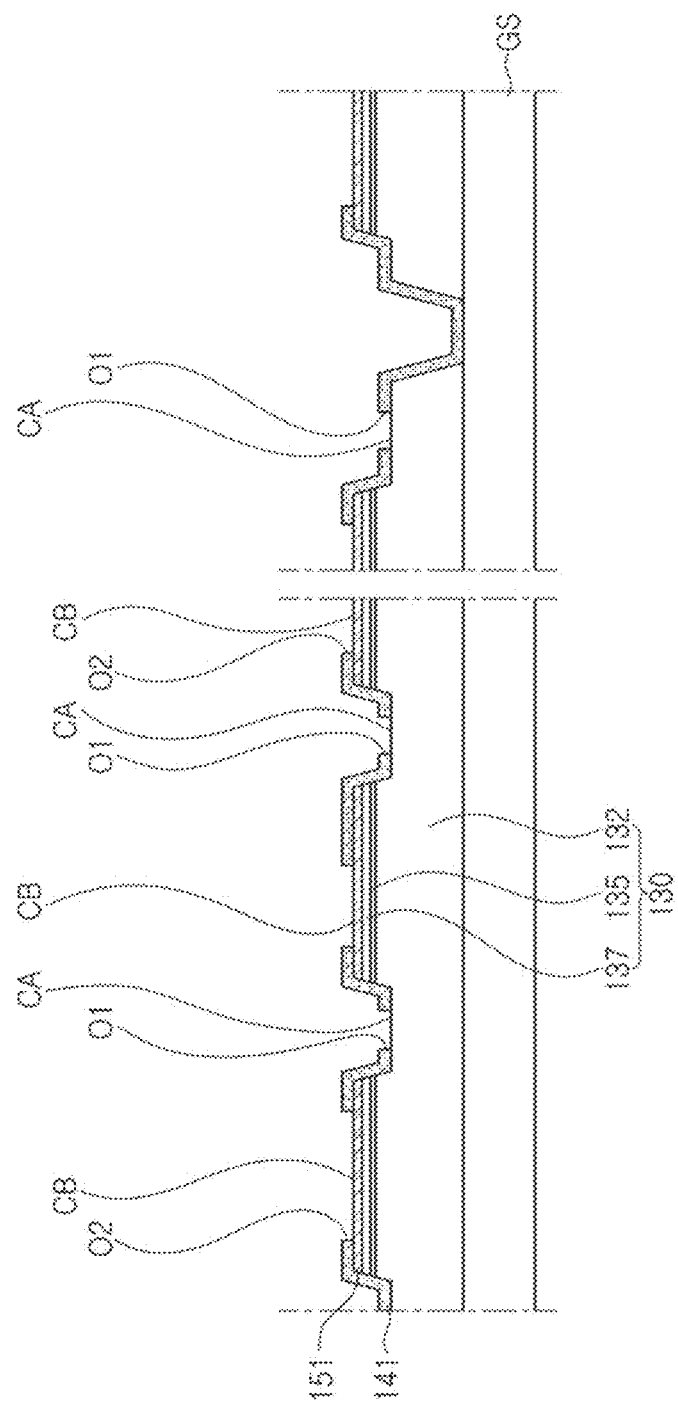

Next, referring to FIG. 4, a first insulating layer 141 having first opening O1 and a second opening O2 may be formed on the semiconductor laminate 130. For example, the first insulating layer 141 may be silicon oxide ($SiO_2$), silicon nitride ($Si_3N_4$), hafnium oxide ($HfO_2$), silicon oxynitride (SiON), titanium oxide ($TiO_2$), tantalum oxide ($Ta_2O_3$) or stannic oxide ($SnO_2$).

The first insulating layer 141 may be formed on an entire upper surface of the semiconductor laminate 130, and then the first and second openings O1 and O2 may be formed on the first insulating layer 141 using a mask. The first and second openings O1 and O2 may define a first contact region CA and a second contact region CB in the first and second conductivity-type semiconductor layers 132 and 137, respectively.

Figure 5:
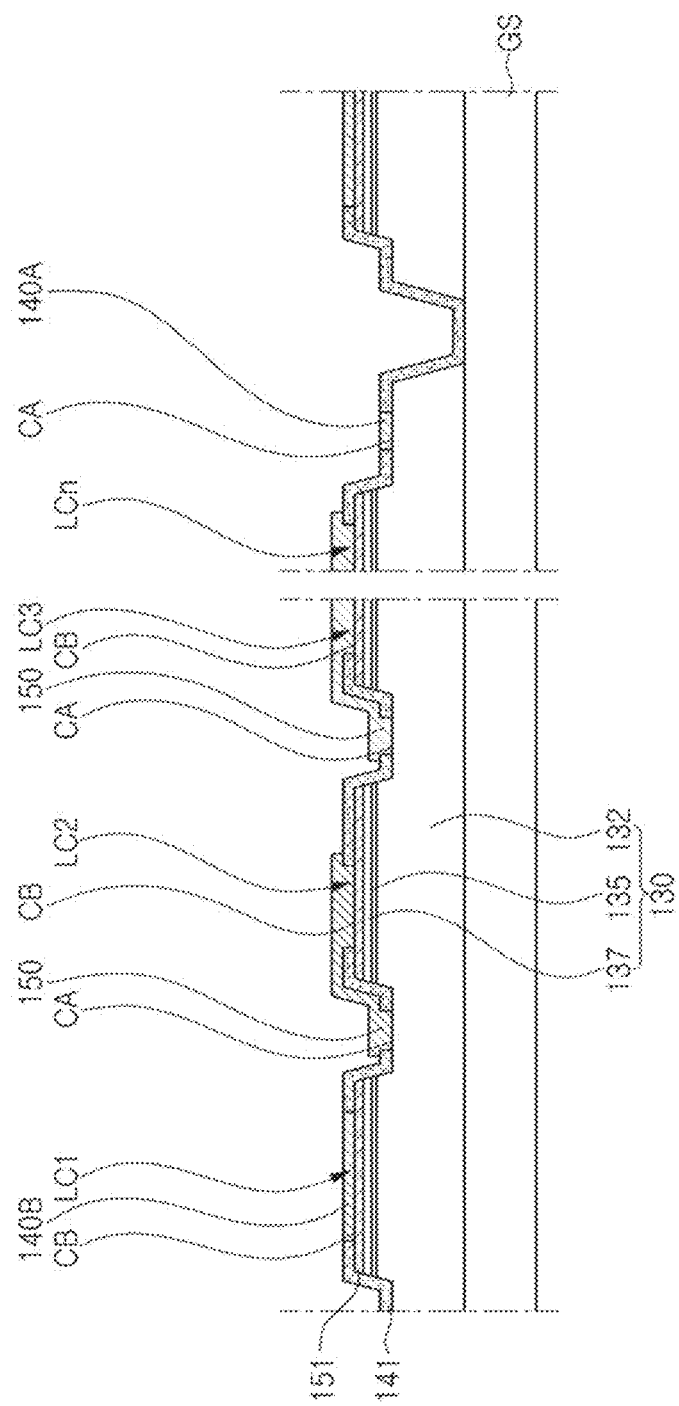

Next, referring to FIG. 5, a connection electrode 150 connecting the first and second contact regions CA and CB of the light emitting structures LC1 to LCn may be formed.

Since the connection electrode 150 is formed along the first insulating layer 141, an unintended connection between the connection electrode 150 and the plurality of light emitting structures LC1 to LCn may be prevented or reduced from occurring. The connection electrode 150 may connect the first and second contact regions CA and CB of adjacent light emitting structure to each other such that the plurality of light emitting structures LC1 to LCn are connected in series. For example, the first contact region CA of the first light emitting structure LC1 of the first light emitting cell LED1 and the second contact region CB of the second light emitting structure LC2 may be connected to each other by the connection electrode 150. The connection electrode 150 may include silver (Ag), nickel (Ni), aluminum (Al), rhodium (Rh), palladium (Pd), iridium (Ir), ruthenium (Ru), magnesium (Mg), zinc (Zn), platinum (Pt), or gold (Au).

A first pad electrode 140A and a second pad electrode 140B may be formed in the first light emitting structure LC1 and the nth light emitting cell LCn, positioned at both ends of the first light emitting cell LED1, respectively, together with the connection electrode 150. The first and second pad electrodes 140A and 140B may provide regions in which electrode pads are to be formed in a subsequent process.

Figure 6:
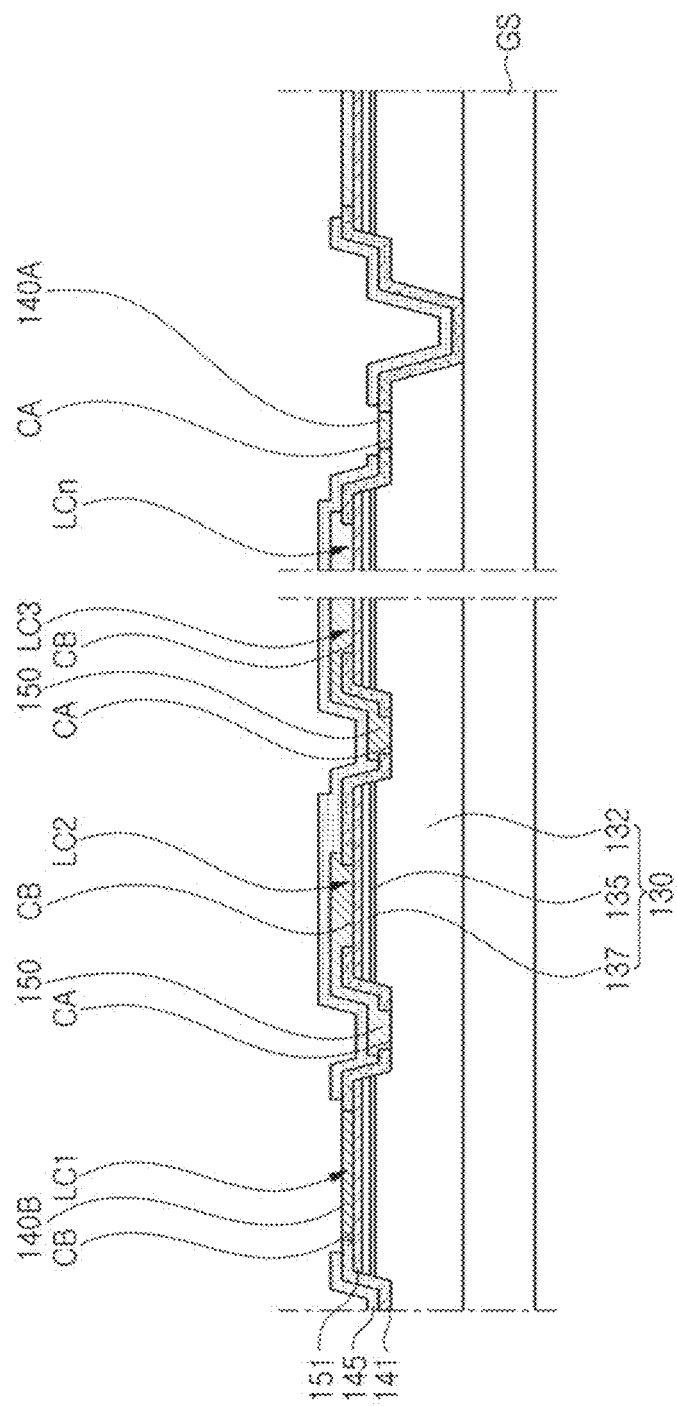

Next, referring to FIG. 6, the second insulating layer 145 may be formed by depositing the same material as the first insulating layer 141. For example, the second insulating layer 145 may be $SiO_2$, $Si_3N_4$, $HfO_2$, SiON, $TiO_2$, $Ta_2O_3$, or $SnO_2$.

Figure 7:
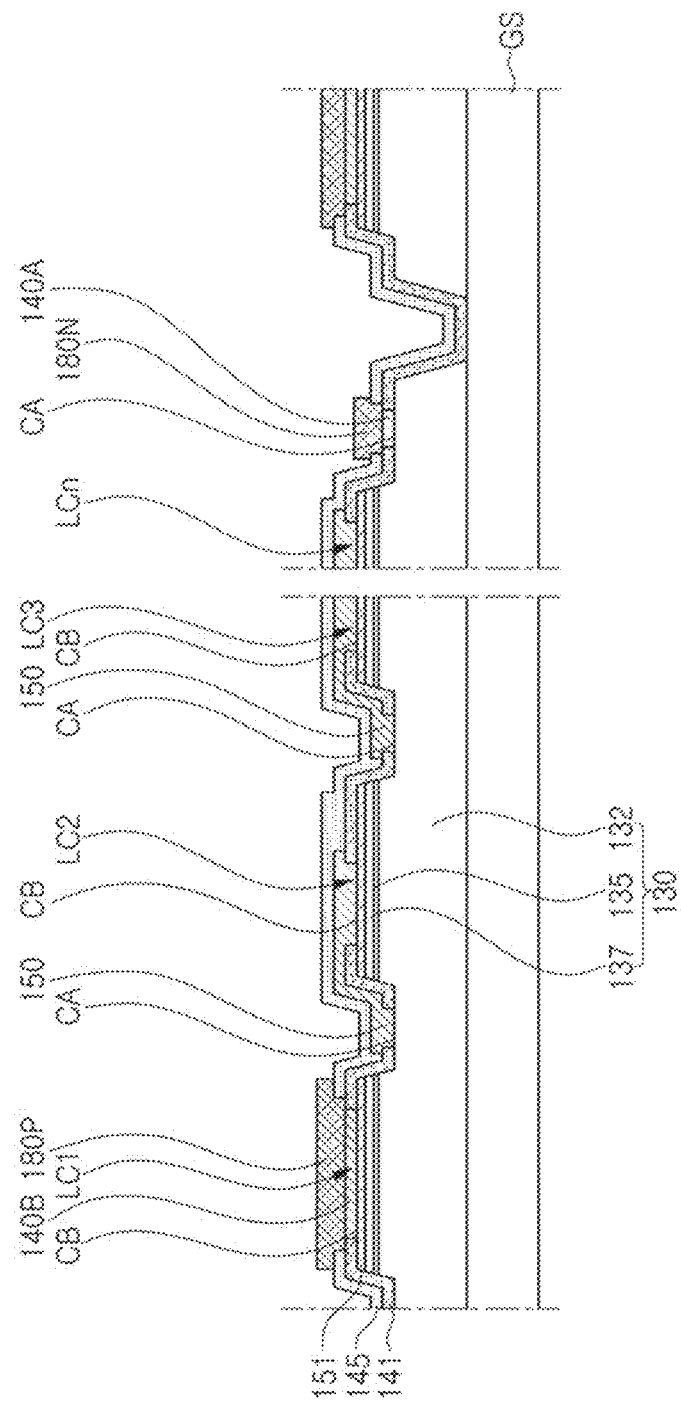

Subsequently, referring to FIG. 7, a first electrode pad 180N and a second electrode pad 180P respectively connected to the first and second pad electrodes 140A and 140B may be formed.

Figure 8:
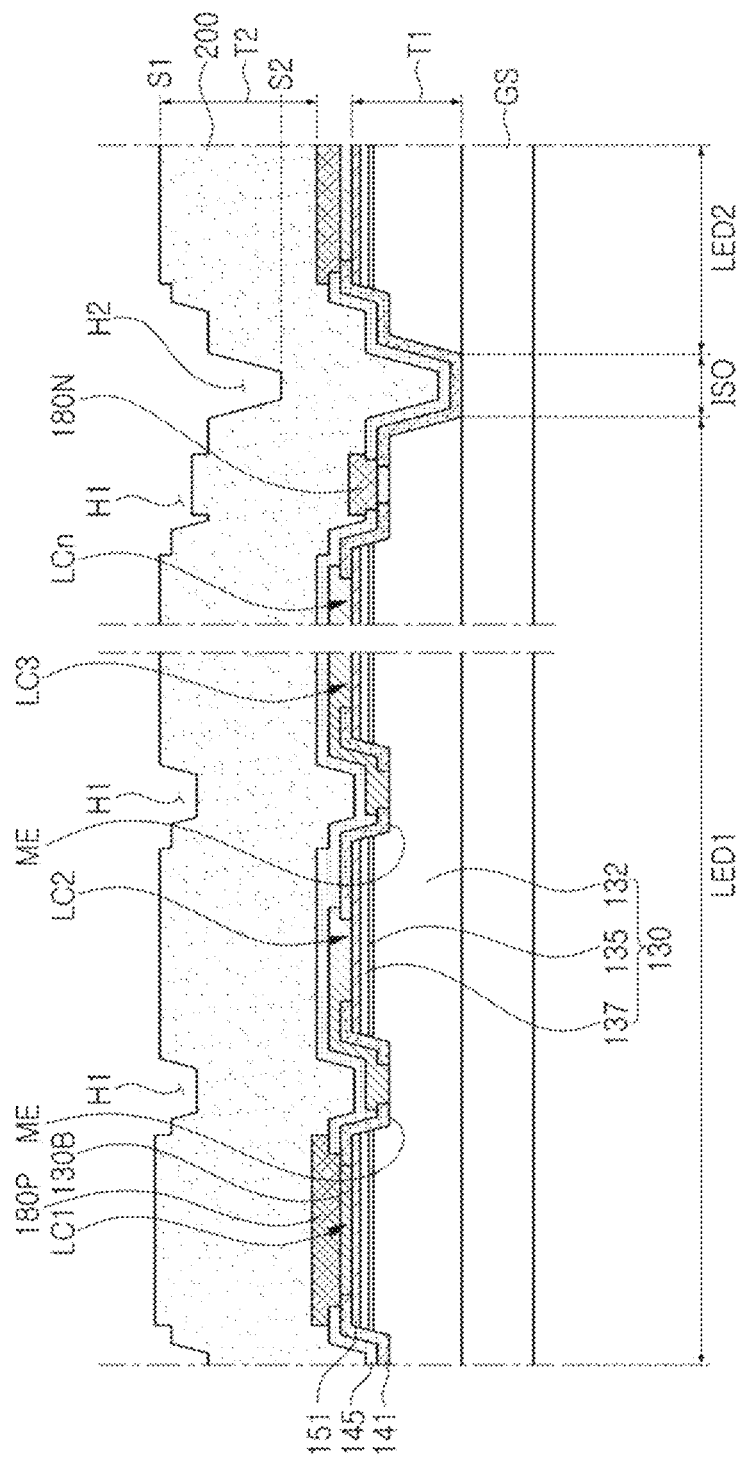

Next, an operation of forming a first planarization layer (S20) may be performed. Referring to FIG. 8, the first planarization layer 200 may be formed to cover the plurality of light emitting cells LED1 and LED2. The first planarization layer 200 may be formed on the second insulating layer 145 and the first and second electrode pads 180N and 180P to have a thickness T2 that is thicker than a thickness T1 of the semiconductor laminate 130. The first planarization layer 200 may be formed to have an overall uniform thickness along a surface of the semiconductor laminate 130. Accordingly, grooves H1 and H2 may be formed on an upper surface Si of the first planarization layer 200 along a surface shape of the mesa-etched region and the device isolation region ISO of the semiconductor laminate 130. In addition, the thickness T2 of the first planarization layer 200 may be adjusted such that an upper surface S2 of the device isolation region ISO, which is a lowest region of the upper surface Si of the first planarization layer 200, is at least 10% or more higher than a height of the second surface 130B of the semiconductor laminate 130. The first planarization layer 200 may provide a planarization layer that fills a step structure generated on the surface of the semiconductor laminate 130 in a process of manufacturing a semiconductor light emitting device, and may be provided as an adhesive surface for adhering a support substrate in a subsequent process. In particular, such a difference in the height created by the step structure is the greatest in a region divided by the device isolation region ISO of the semiconductor laminate 130, and when the support substrate is bonded in a state in which planarization is not performed, a void may be generated between the support substrate and the semiconductor laminate 130. The void may block a movement of heat, and may cause defects due to deterioration of a heat generation efficiency of a completed semiconductor light emitting device.

In addition, such a planarization layer may provide a surface for forming a wiring pattern. Therefore, the problem that the wiring pattern is disconnected by forming the wiring pattern on the semiconductor laminate in which the step is formed can be alleviated.

The first planarization layer 200 may be made of a silicon oxide or a silicon nitride. In an example embodiment, the first planarization layer 200 may be formed by depositing $SiO_2$, $Si_3N_4$, $HfO_2$, SiON, $TiO_2$, $Ta_2O_3$, or $SnO_2$, which are similar insulating materials to the first and second insulating layers 141 and 145. The first planarization layer 200 may be made of an insulating material that is similar in an etching selectivity to dry etching as the second planarization layer 300 stacked in a subsequent process. In an example embodiment, the first planarization layer 200 and the second planarization layer 300 may be made of a material having an etching selectivity of 1:0.1 to 1:2.0 in a subsequent dry etching process. When the first planarization layer 200 and the second planarization layer 300 are made of a material having an etching selectivity close to 1:1, the upper surface of the first planarization layer 200 that has undergone the dry etching process may be formed as a flat surface.

Figure 9:
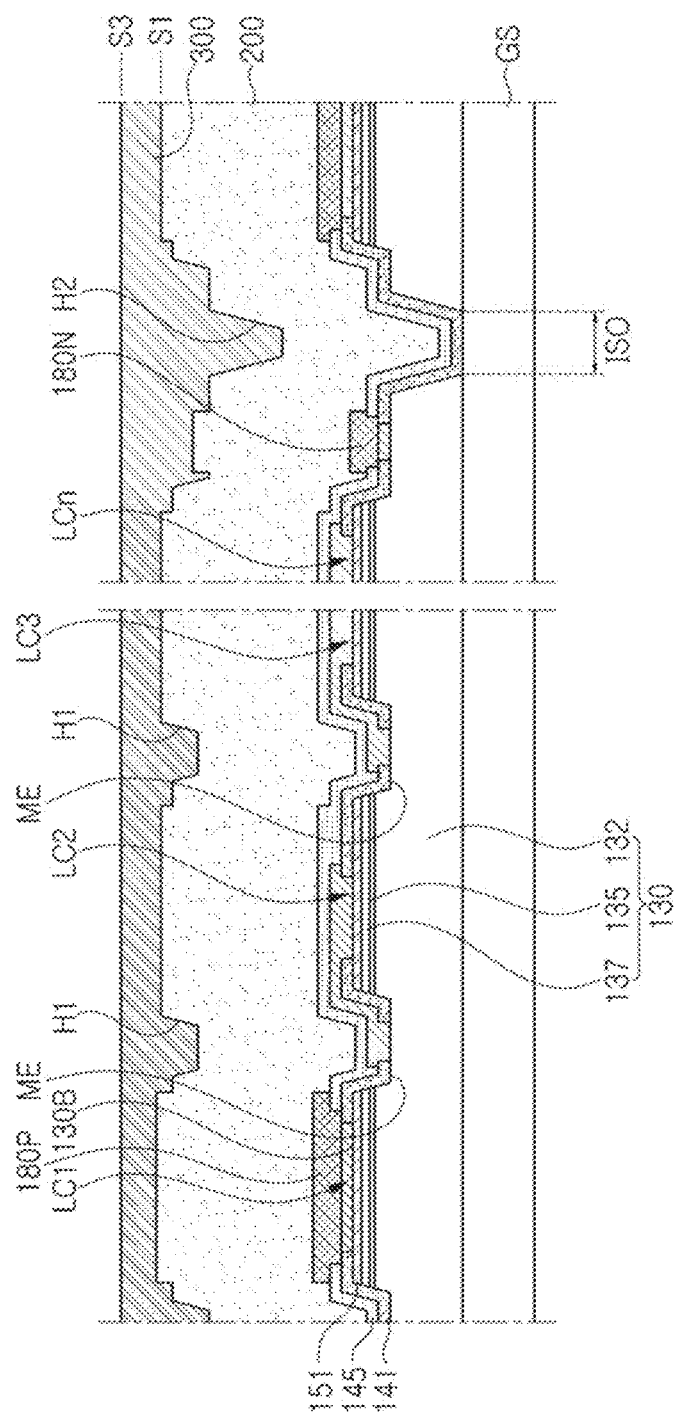

Next, an operation of forming a second planarization layer (S30) may be performed. Referring to FIG. 9, the second planarization layer 300 may be formed to cover the upper surface S1 of the first planarization layer 200. The second planarization layer 300 may be formed to fill groove portions H1 and H2 formed on the upper surface of the first planarization layer 200 such that the upper surface S3 of the second planarization layer 300 forms a flat surface. The second planarization layer 300 may be formed by applying a photoresist on the first planarization layer 200 and soft baking the photoresist.

Next, an operation of dry etching the first and second planarization layers 200 and 300 (S40) may be performed.

Figure 10:
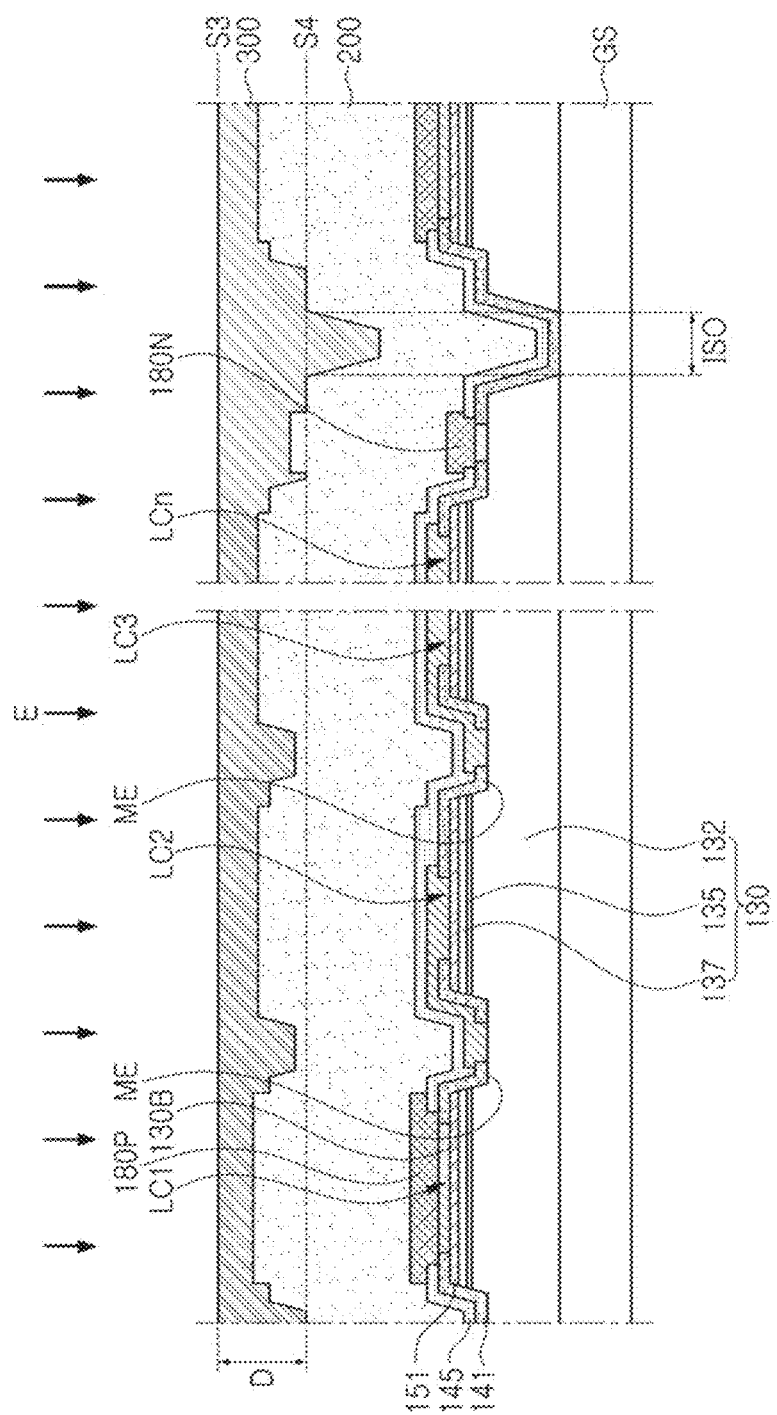
Figure 11:
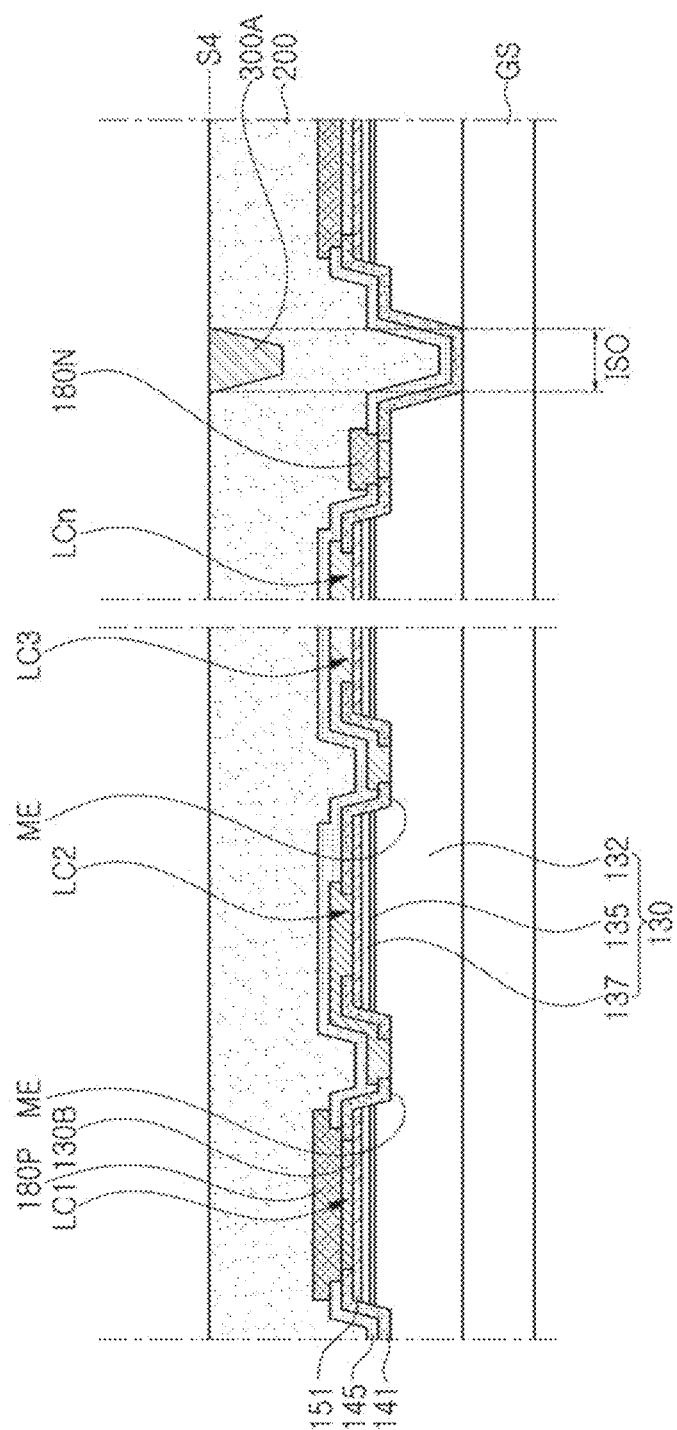

Referring to FIGS. 10 and 11, dry etching E may be performed in an upper surface S3 direction of the second planarization layer 300 such that a portion of the first planarization layer 200 and a portion of the second planarization layer 300 may be removed. In an example embodiment, dry etching may be performed from the upper surface S3 of the second planarization layer 300 to a surface S4 having a predetermined depth D from the upper surface S3. The predetermined depth D may be a depth at which a portion of the second planarization layer 300 except for a portion formed in the device isolation region ISO may be removed. In an example embodiment, the predetermined depth D may be about 1 μm, but embodiments are not limited thereto. When the first planarization layer 200 is formed to be relatively thick and the second planarization layer 300 formed in the device isolation region ISO is also removed, and when the remaining first planarization layer is provided as a surface for adhering the support substrate in a subsequent process, the second planarization layer 300 formed in the device isolation region ISO may also be removed through one dry etching process. The dry etching process may be performed by reactive ion etching (RIE), vapor phase etching, and the like. Dry etching may be performed using gases such as chlorine ($Cl_2$), boron trichloride ($BCl_3$), carbon tetrafluoride ($CF_4$), sulfur hexafluoride ($SF_6$), octafluorocyclobutane ($C_4F_8$), argon (Ar), nitrogen ($N_2$), and oxygen ($O_2$), in an example embodiment, dry etching may be performed using a $CF_4$ gas.

Next, an operation of checking whether a second planarization layer 300 remains (S50) may be performed. According to example embodiments, the operation of checking whether the second planarization layer 300 remains (S50) may be omitted. According to each parameter of the dry etching process, when a depth in which the first and second planarization layers 200 and 300 are etched is confirmed, a subsequent process may be performed without checking whether the second planarization layer 300 remains.

Figure 12:
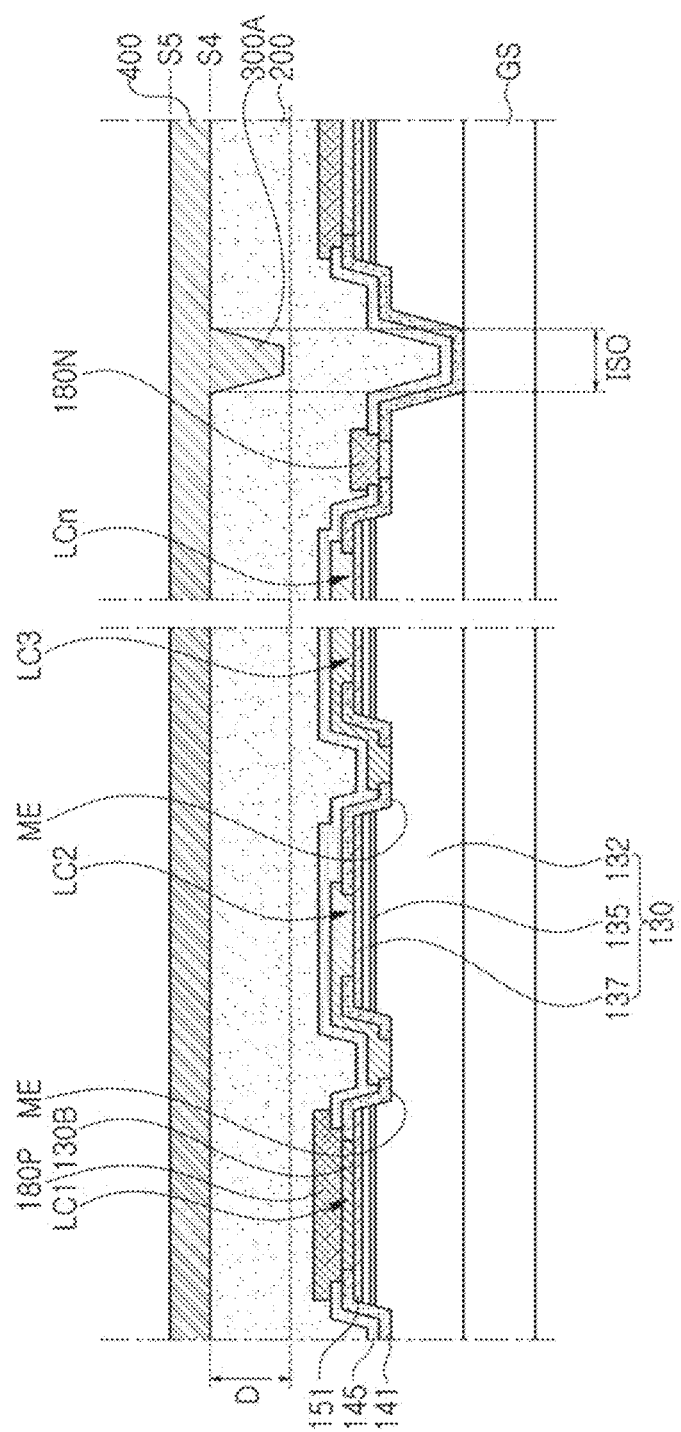
Figure 13:
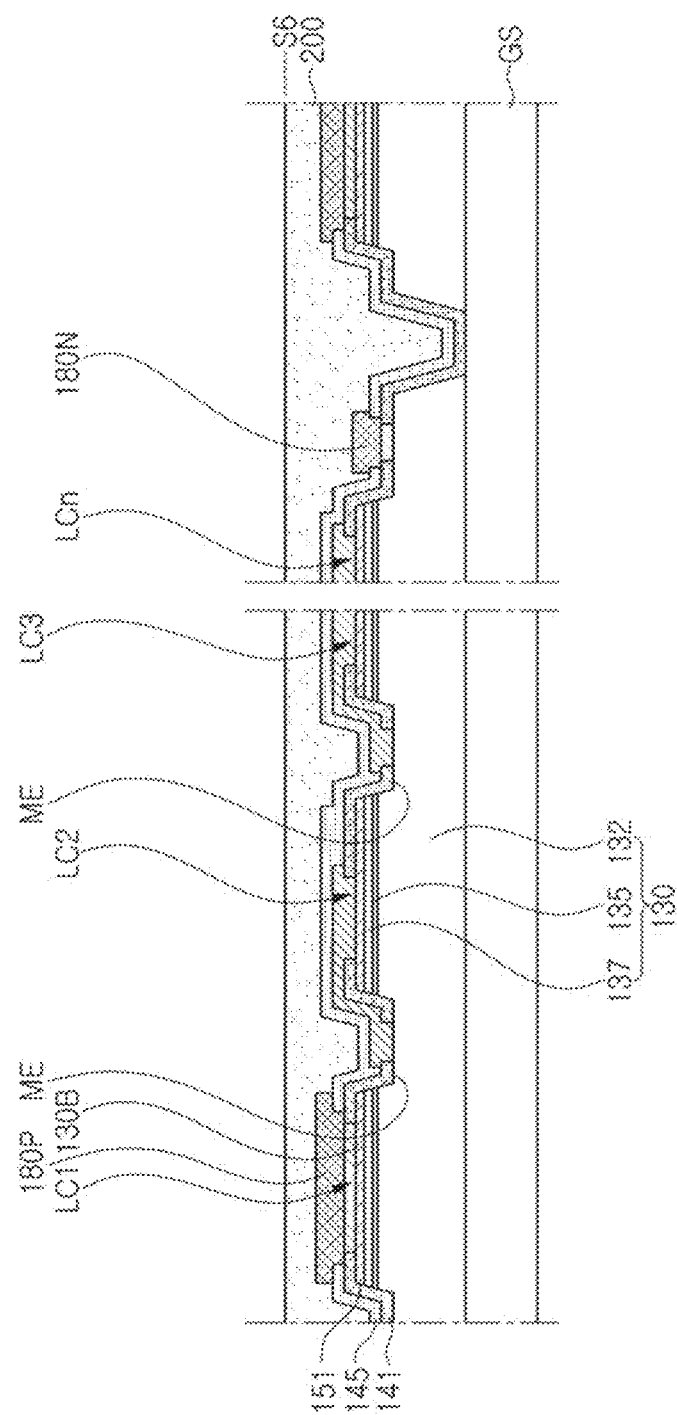

FIG. 11 is a view illustrating a state after the dry etching is performed. FIG. 11 illustrates that the dry etching is performed to planarize an upper surface S4 of the first planarization layer 200, and a portion of the second planarization layer 300A remains in the device isolation region ISO. In this case, the portion of second planarization layer 300A may be removed by repeating the process of removing by dry etching, after the second planarization layer 300A forms the second planarization layer 300 again. After the second planarization layer 300 is formed again, the process of removing by dry etching may be repeated two times or more. FIGS. 12 and 13, thereafter, illustrate this repeating process.

Next, referring to FIG. 12, the second planarization layer 400 may be formed again to cover the upper surface S4 of the first planarization layer 200. The second planarization layer 400 may be prepared by applying the same photoresist as that of the process of forming the second planarization layer 300 to cover the first planarization layer 200 to form an upper surface S5, and soft baking the photoresist.

Figure 18:
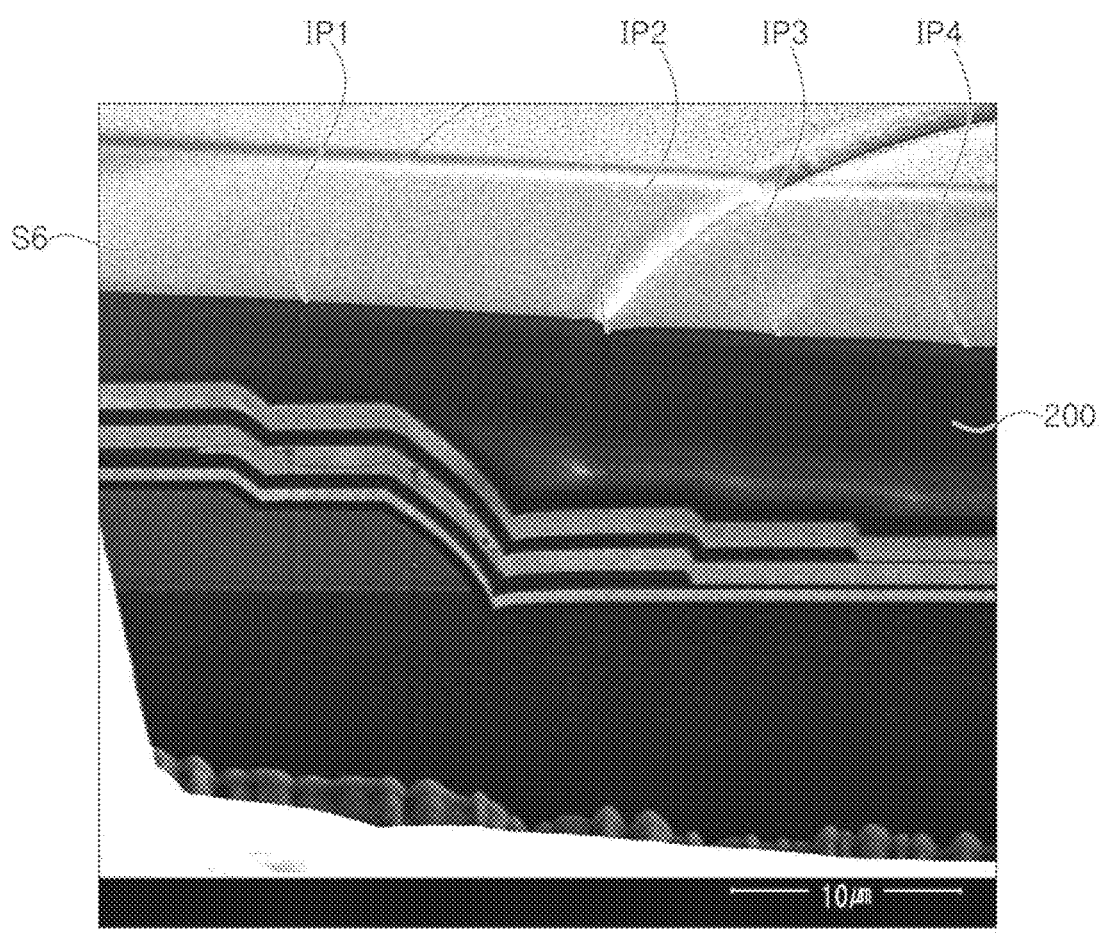
FIG. 18 is an scanning electron microscope (SEM) photograph of the first planarization layer of FIG. 13.

FIG. 13 is a view illustrating that dry etching is performed again to a predetermined depth D in the second planarization layer 400 and the portion of second planarization layer 300A of FIG. 11 remaining in the device isolation ISO is removed. FIG. 13 illustrates that the portion of second planarization layer 300A is removed and only the first planarization layer 300 remains, and a flat surface is formed on the upper surface S6 of the first planarization layer 200. However, according to an example embodiment, a portion of the upper surface S6 of the first planarization layer 200 may have a gentle curved surface, or the upper surface S6 may be formed with a gentle curved surface as a whole. In addition, according to an example embodiment, an inflection point may be formed in a portion of the upper surface S6 of the first planarization layer 200. FIG. 18 is a SEM photograph of the first planarization layer of FIG. 13. FIG. 18 shows that inflection points IP1 to IP4 are formed on the upper surface S6 of the first planarization layer 200. These inflection pointes IP1 to IP4 may occur in the process of repeatedly performing dry etching. Therefore, the inflection points IP1 to IP4 may be formed as many times as the dry etching process is performed.

Through such a process, in an example embodiment, a planarization process for reducing the step structure of the semiconductor laminate 130 on the semiconductor laminate 130 may be performed without a physical planarization process such as a chemical mechanical polishing (CMP) process. Therefore, without an additional equipment for performing the planarization process, the planarization process may be performed using only the equipment of the existing process. Therefore, manufacturing costs of the semiconductor light emitting device may be reduced.

Figure 14:
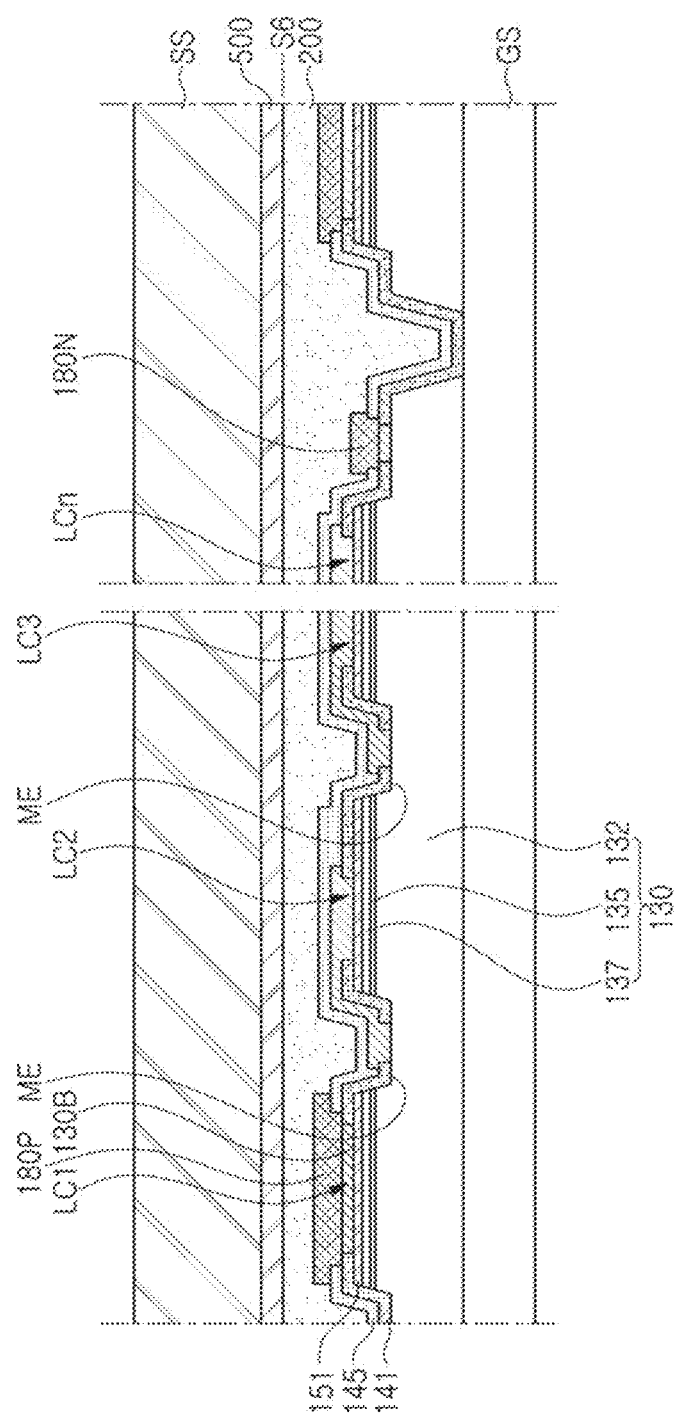

Next, referring to FIG. 14, a bonding layer 500 may be formed on the upper surface S6 of the first planarization layer 200, and a support substrate SS may be attached. The support substrate SS is a supporter for preventing or reducing damages to the semiconductor laminate 130 in a subsequent manufacturing process, and various substrates may be used as. In an example embodiment, the support substrate SS may be used a Si substrate made of the same material of the growth substrate GS.

Figure 15:
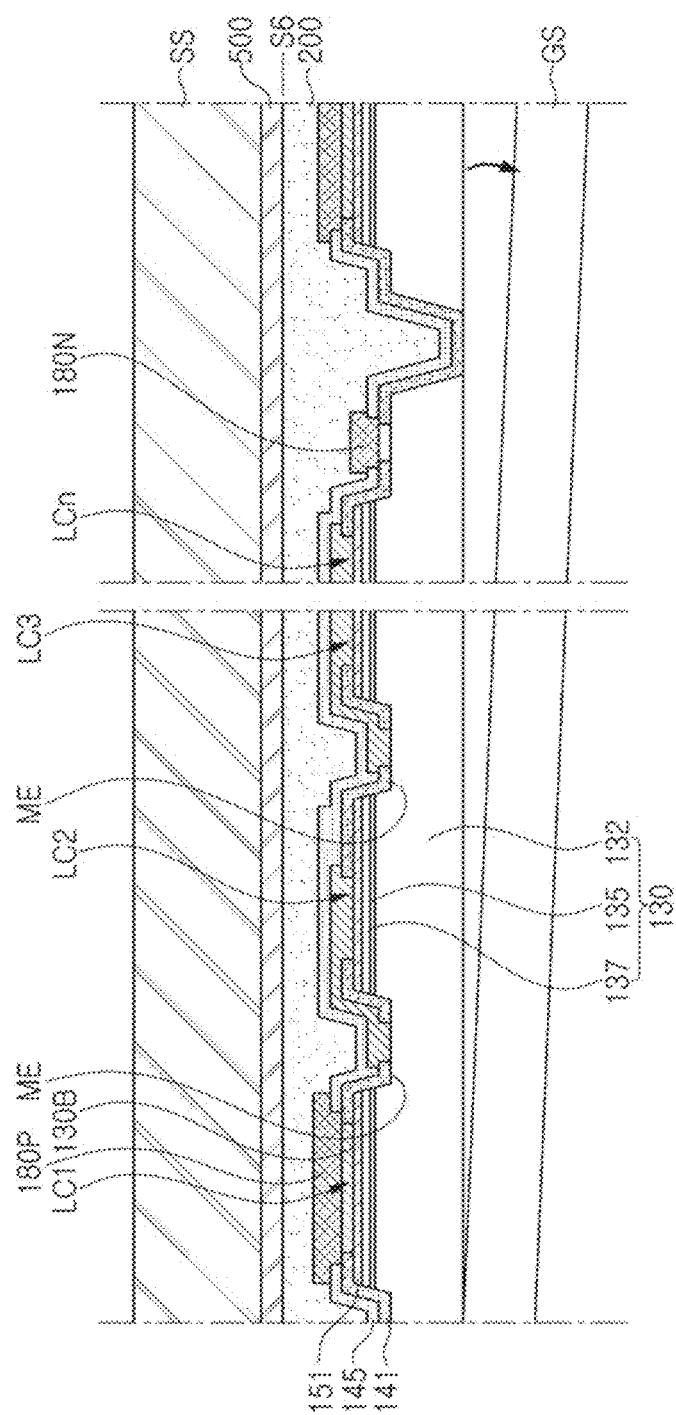

Next, referring to FIG. 15, the growth substrate GS may be removed from the semiconductor laminate 130.

Removal of the growth substrate GS may be performed by various processes such as laser lift off (LLO), mechanical polishing, mechanical chemical polishing, and chemical etching. In a case in which the Si substrate is used as the growth substrate GS, the mechanical strength is relatively low, and thus the growth substrate GS may be removed using a mechanical or a mechanical chemical polishing process.

Figure 16:
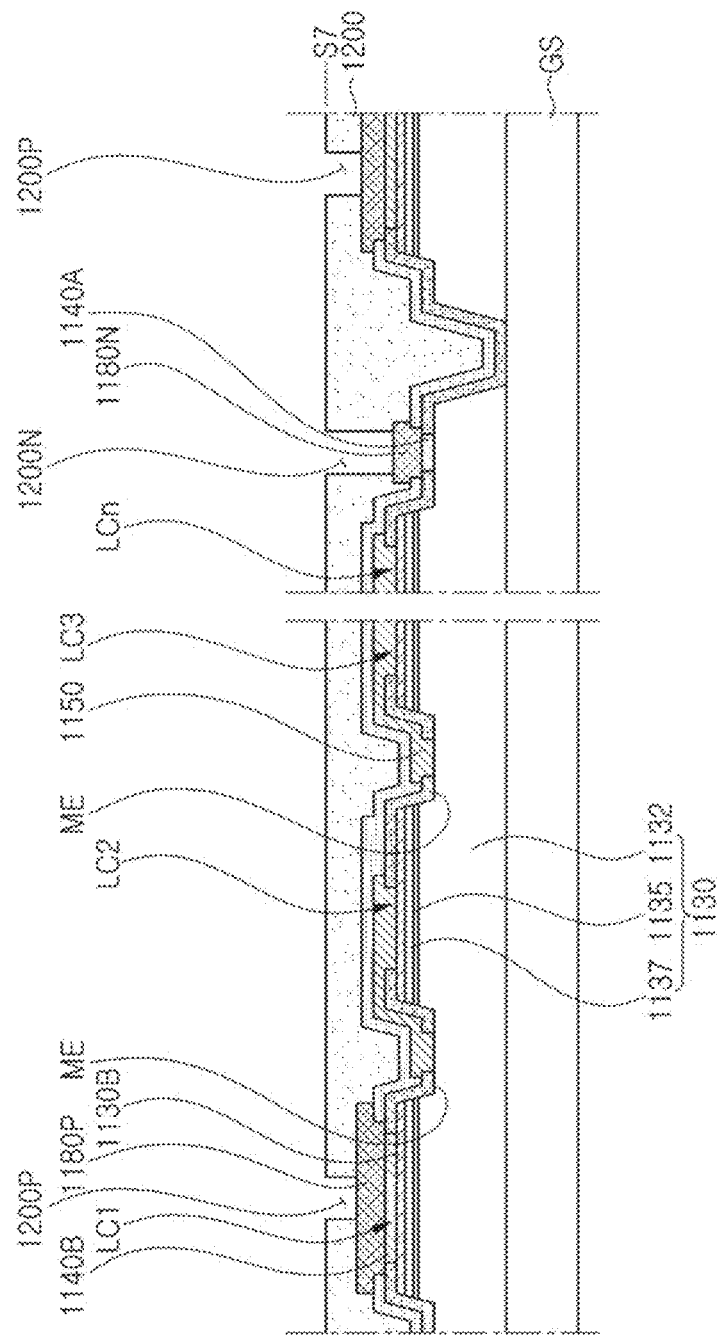
FIGS. 16 and 17 are cross-sectional views illustrating a method of a manufacturing a semiconductor light emitting device according to an example embodiment.
Figure 17:
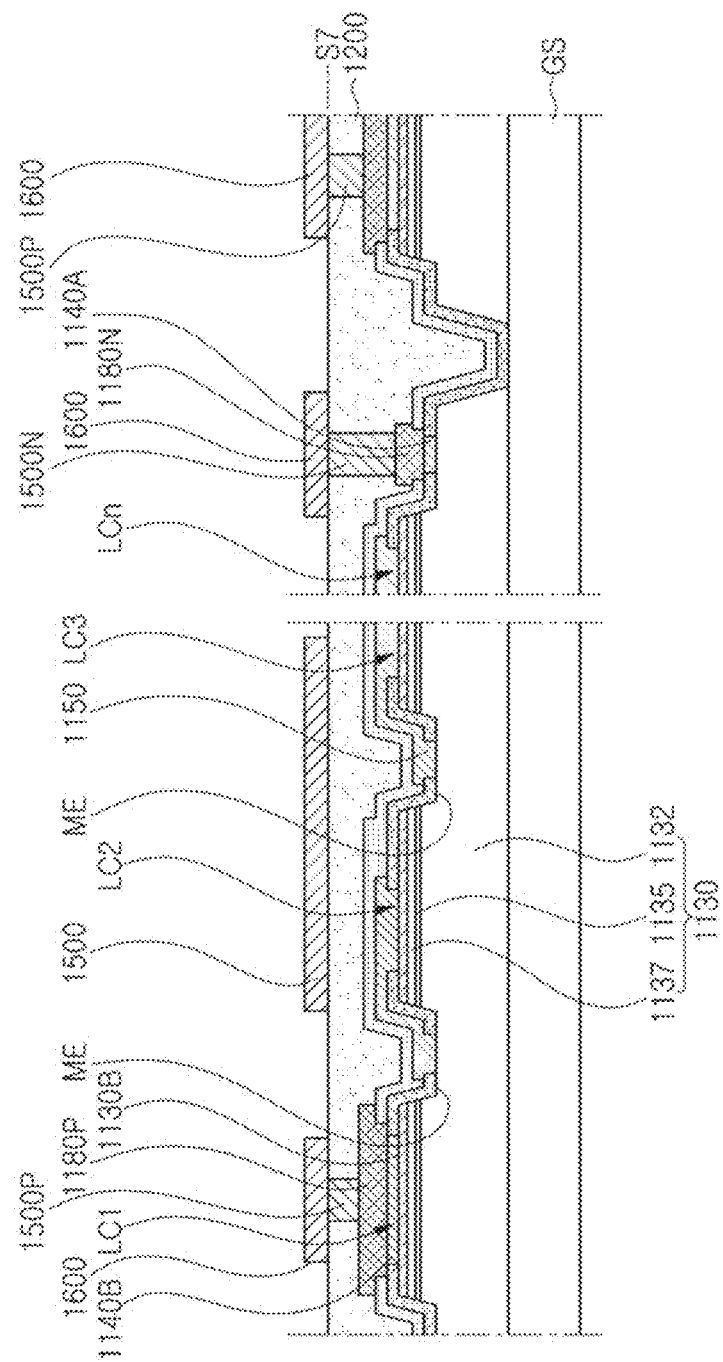

Next, a manufacturing method of a semiconductor light emitting device according to an example embodiment will be described with reference to FIGS. 16 and 17. FIGS. 16 and 17 are cross-sectional views illustrating a manufacturing method of a semiconductor light emitting device according to an example embodiment. An example embodiment is different from the above-described example embodiment in that the wiring pattern is formed on the planarized semiconductor laminate. FIGS. 16 and 17 illustrate a subsequent process after FIG. 13 of the above-described example embodiment.

Referring to FIG. 16, a semiconductor laminate 1130 may include a first conductivity-type semiconductor layer 1132 and a second conductivity-type semiconductor layer 1137, and an active layer 1135 disposed therebetween. The semiconductor laminate 1130 may be divided into a plurality of light emitting structures LC1 to LCn by the mesa-etched region ME, and the plurality of light emitting structures LC1 to LCn may be connected by a connection electrode 1150. As in the above-described example embodiment, first and second pad electrodes 1140A and 1140B may be formed in the first light emitting structure LC1 and the nth light emitting cell LCn, respectively. It can be seen that a first planarization layer 1200 having a planarized upper surface S7 by a dry etching process is disposed on the plurality of light emitting structures LC1 to LCn. First and second via holes 1200N and 1200P in which first and second electrode pads 1180N and 1180P are exposed at the bottom may be formed by penetrating through the first planarization layer 1200.

Referring to FIG. 17, first and second via electrodes 1500P and 1500N are formed to fill the first and second via holes 1200N and 1200P, respectively, and a wiring pattern 1600 connected to the first and second via electrodes 1500P and 1500N may be disposed.

In an example embodiment, since the wiring pattern 1600 is disposed on a planarized upper surface S7 of the first planarization layer 1200, disconnection of the wiring pattern generated when the wiring pattern is disposed on the semiconductor laminate having a step structure may be prevented or reduced.

As set forth above, according to an example embodiment, in a manufacturing method of a semiconductor light emitting device, a surface of the semiconductor light emitting device may be flattened without a separate physical planarization process such as a chemical mechanical polishing (CMP) process. Thus, manufacturing costs of the semiconductor light emitting device may be reduced.

While the example embodiments have been shown and described above, it will be apparent to those skilled in the art that modifications and variations could be made without departing from the scope of the present inventive concept as defined by the appended claims.

What is claimed is:

1. A manufacturing method of a semiconductor light emitting device, the manufacturing method comprising:
   forming a plurality of light emitting cells that are individually separated on a first substrate;
   forming a first planarization layer by providing an insulating material on the plurality of light emitting cells, a thickness of the first planarization layer being greater than a thickness of the plurality of light emitting cells;
   forming a second planarization layer by providing a photoresist on the first planarization layer to have a flat upper surface, and soft baking the photoresist; and
   dry etching the second planarization layer to a predetermined depth to expose a portion of the first planarization layer provided on the plurality of light emitting cells, and a portion of the second planarization layer remaining between the plurality of light emitting cells on the first planarization layer,
   wherein the forming the second planarization layer and the dry etching are repeated in an order of forming the second planarization layer and dry etching at least once to remove the portion of the second planarization layer provided between the plurality of light emitting cells.

2. The manufacturing method of the semiconductor light emitting device of claim 1, wherein forming the plurality of light emitting cells comprises:
   sequentially forming a first conductivity-type semiconductor layer, an active layer, and a second conductivity-type semiconductor layer on the first substrate; and
   partially etching the first conductivity-type semiconductor layer, the active layer, and the second conductivity-type semiconductor layer, respectively, to expose a portion of the first substrate.

3. The manufacturing method of the semiconductor light emitting device of claim 2, wherein the plurality of light emitting cells comprise a plurality of light emitting structures which share the first conductivity-type semiconductor layer, respectively and in which the active layer and the second conductivity-type semiconductor layer are separately provided.

4. The manufacturing method of the semiconductor light emitting device of claim 3, further comprising forming a connection electrode connecting adjacent light emitting structures of the plurality of light emitting structures.

5. The manufacturing method of the semiconductor light emitting device of claim 2, further comprising:
   forming a first electrode on the first conductivity-type semiconductor layer and forming a second electrode on the second conductivity-type semiconductor layer, after forming the plurality of light emitting cells.

6. The manufacturing method of the semiconductor light emitting device of claim 1, wherein the first substrate is a growth substrate.

7. The manufacturing method of the semiconductor light emitting device of claim 1, wherein the first planarization layer and the second planarization layer have an etching selectivity of 1:0.1 to 1:2.0 with respect to the dry etching.

8. The manufacturing method of the semiconductor light emitting device of claim 1, wherein the insulating material is formed of silicon oxide or silicon nitride.

9. The manufacturing method of the semiconductor light emitting device of claim 1, further comprising bonding a second substrate on the first planarization layer after the dry etching.

10. The manufacturing method of the semiconductor light emitting device of claim 9, wherein the first substrate and the second substrate are made of a same composition material.

11. The manufacturing method of the semiconductor light emitting device of claim 1, wherein forming the first planarization layer comprises filling a separation space provided between the plurality of light emitting cells.

12. A manufacturing method of a semiconductor light emitting device, the manufacturing method comprising:
    forming a semiconductor laminate by sequentially stacking a first conductivity-type semiconductor layer, an active layer, and a second conductivity-type semiconductor layer on a growth substrate;
    forming a plurality of light emitting cells on a mesa region partitioned by a separation space that is formed by etching a portion of the semiconductor laminate to expose the growth substrate, the plurality of light emitting cells comprising a plurality of light emitting structures that share the first conductivity-type semiconductor layer, and in which the active layer and the second conductivity-type semiconductor layer are separately provided;
    forming a first planarization layer by providing an insulating material on the plurality of light emitting cells and the separation space, a thickness of the first planarization layer being greater than a thickness of the semiconductor laminate;
    forming a second planarization layer on the first planarization layer by providing a photoresist on the first planarization layer and soft baking the photoresist; and
    dry etching the second planarization layer to a predetermined depth from an upper surface direction of the second planarization layer to expose a portion of the first planarization layer overlapping the mesa region, and a portion of the second planarization layer provided between the plurality of light emitting cells remaining on the first planarization layer,
    wherein the forming the second planarization layer and the dry etching are repeated in an order of forming the second planarization layer and dry etching at least once to remove the portion of the second planarization layer provided between the plurality of light emitting cells.

13. The manufacturing method of the semiconductor light emitting device of claim 12, wherein a height of a lowest region of an upper surface of the first planarization layer is 10% or more higher than a height of a highest region of an upper surface of the second conductivity-type semiconductor layer.

14. The manufacturing method of the semiconductor light emitting device of claim 12, wherein an etching rate of the insulating material is substantially equal to an etching rate of the photoresist.

15. The manufacturing method of the semiconductor light emitting device of claim 12, wherein the growth substrate is a silicon substrate.

16. A manufacturing method of a semiconductor light emitting device, the manufacturing method comprising:
   forming a plurality of light emitting cells respectively comprising a first conductivity-type semiconductor layer, an active layer, and a second conductivity-type semiconductor layer that are sequentially stacked on a growth substrate, and partitioned by a separation space in which the growth substrate is exposed;
   forming a first planarization layer comprising an upper surface that is higher than an upper surface of the second conductivity-type semiconductor layer by depositing an insulating material on the plurality of light emitting cells and the separation space;
   forming a second planarization layer by providing a photoresist on the first planarization layer and soft baking the photoresist; and
   dry etching the second planarization layer to a predetermined depth from an upper surface direction of the second planarization layer to expose a portion of the second planarization layer overlapping the plurality of light emitting cells of the first planarization layer, and a portion of the second planarization layer provided between the plurality of light emitting cells remaining on the first planarization layer,
   wherein the forming the second planarization layer and the dry etching are repeated in an order of forming the second planarization layer and dry etching at least once to remove the portion of the second planarization layer positioned between the plurality of light emitting cells.

17. The manufacturing method of the semiconductor light emitting device of claim 16, wherein a height of a lowest region of the upper surface of the first planarization layer is 10% or more higher than a height of a highest region of the upper surface of the second conductivity-type semiconductor layer.

18. The manufacturing method of the semiconductor light emitting device of claim 17, wherein the growth substrate is a silicon substrate.

19. The manufacturing method of the semiconductor light emitting device of claim 16, wherein the plurality of light emitting cells comprise a plurality of light emitting structures sharing the first conductivity-type semiconductor layer, respectively, and in which the active layer and the second conductivity-type semiconductor layer are separately provided.

20. The manufacturing method of the semiconductor light emitting device of claim 19, wherein the plurality of light emitting structures are electrically connected to each other.

* * * * *